United States Patent
Kuo et al.

(10) Patent No.: US 8,964,143 B2
(45) Date of Patent: Feb. 24, 2015

(54) LIQUID CRYSTAL DISPLAY DEVICE, BACKLIGHT MODULE AND BACKBOARD STRUCTURE

(75) Inventors: Yi-cheng Kuo, Guandong (CN);
Yu-chun Hsiao, Guandong (CN);
Chengwen Que, Guandong (CN);
Pangling Zhang, Guandong (CN);
Dehua Li, Guandong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 205 days.

(21) Appl. No.: 13/583,003

(22) PCT Filed: Jul. 23, 2012

(86) PCT No.: PCT/CN2012/078989
§ 371 (c)(1),
(2), (4) Date: Sep. 6, 2012

(87) PCT Pub. No.: WO2014/012260
PCT Pub. Date: Jan. 23, 2014

(65) Prior Publication Data
US 2014/0022486 A1    Jan. 23, 2014

(30) Foreign Application Priority Data

Jul. 17, 2012 (CN) .......................... 2012 1 0247382

(51) Int. Cl.
*H05K 7/18* (2006.01)
*G02F 1/1335* (2006.01)
*G09F 13/04* (2006.01)

(52) U.S. Cl.
CPC ................ *H05K 7/18* (2013.01); *G02F 1/1336* (2013.01); *G09F 13/04* (2013.01)
USPC .......................................................... 349/58

(58) Field of Classification Search
USPC .......................................................... 349/58
See application file for complete search history.

(56) References Cited

U.S. PATENT DOCUMENTS 8,692,951 B2 * 4/2014 Tanaka ........................... 349/58

* cited by examiner

*Primary Examiner* — James Dudek
(74) *Attorney, Agent, or Firm* — Andrew C. Cheng

(57) ABSTRACT

The present invention provides a backlight module and a backboard structure incorporated therein. The backboard structure is configured with a first bracket having the buckle, and a second bracket having defined with the retaining slot. With the interengagement between the buckle and the retaining slot, the embossment and the positioning slot, the backboard structure can be readily constructed by the assembling of the first and second brackets. Since no screws are necessary for the assembling of the backboard structure, no laborious work is required as well. This can effectively reduce the manufacturing cost, and is really beneficial to the automation.

14 Claims, 3 Drawing Sheets

LIQUID CRYSTAL DISPLAY DEVICE, BACKLIGHT MODULE AND BACKBOARD STRUCTURE

FIELD OF THE INVENTION

The present invention relates to a technical field of liquid crystal, and more particularly, to a backboard structure incorporated within a backlight module. The present invention further relates to a liquid crystal display device incorporated with such backlight module.

DESCRIPTION OF PRIOR ART

In the existing prior art, most of the backboard incorporated within the backlight module is through assembling from individual parts. The interengagement between the parts are made through screws and then configure the backboard. The assembled backboard is then assembled to the backlight module, which is later assembled to a liquid crystal display device.

However, since the interengagement between the parts needs screws, a tremendous laborious works are needed and which inevitably increase the cost. In addition, the laborious and manual assembling of the backboard is really detrimental to the automation of the production line.

SUMMARY OF THE INVENTION

It is the object of the present invention to provide a technical solution to address a liquid crystal display device, a backlight module, and a backboard structure. The novel configuration can readily reduce manufacturing, cost and promote automation of production line.

In order to resolve the technical issues encountered by the prior art, the present invention introduce a solution by providing as liquid crystal display device, wherein the liquid crystal display device is configured with a panel, a backlight module, and a backboard structure incorporated in the backlight module. Wherein the backboard structure is configured with a first bracket and a second bracket, the first bracket including a first bottom, a first sidewalk and a buckle disposed on the first bottom, the buckle including a neck stemmed from the bottom of the first bracket, and a presser arranged on a free end of the neck, the second bracket including a raised portion, a second bottom and a second sidewalk a retaining slot being defined in the bottom and configured with a first retaining opening and a slit in communication with the first retaining opening, the first retaining opening being tailored such that the presser can freely pass therethrough, and a thickness of the slit being tailored such that the neck can readily move between the first retaining opening and the slit, wherein when the presser passes through the first retaining opening and located above the bottom of the second bracket and the neck being moved to enter the slit so as to have the presser pressing down the bottom of the second bracket, interengagement between the buckle and the retaining slot facilitating interconnection between the first bracket and the second bracket. Wherein the backlight module includes an optical module supported by the first bottom and the second bottom, the first sidewall and the second sidewall being arranged along peripheral of the optical module. And wherein the first sidewall is provided with a first tab in a position away from the bottom, and the second sidewall is provided with a second tab in a position away from the second bottom, the first and second tabs are used to position the optical module and support the liquid crystal display panel.

Wherein the first bracket is defined with a positioning slot, and the raised portion of the second bracket is arranged with embossment, or alternatively, the first bracket is arranged with an embossment, and the second bracket is defined with the positioning slot, interengagement between the positioning slot and the embossment can effectively prevent relative movement between the first bracket and the second bracket.

Wherein further comprises a compliant portion in which the positioning slot is located, wherein the embossment push against the compliant portion so as to enter the positioning slot.

In order to resolve the technical issues encountered by the prior art, the present invention introduce a solution by providing a backboard structure for backlight module which comprises a first bracket arranged with a buckle. And a second bracket is arranged with a raised portion and a retaining slot defined in the raised portion, interengagement between the buckle and the retaining slot facilitating interconnection between the first and second brackets.

Wherein the buckle includes a neck stemmed from a bottom of the first bracket, and a presser arranged on a free end of the neck. Wherein the retaining slot includes a first retaining opening and a slit, the first retaining opening being tailored such that the presser can freely pass therethrough, and a thickness of the slit being tailored such that the neck can readily move between the first retaining opening and the slit. And wherein when the presser passes through the first retaining opening and located above the bottom of the second bracket, and the neck being moved to enter the slit so as to have the presser pressing down the bottom of the second bracket, interengagement between the buckle and the retaining slot facilitating interconnection between the first bracket and the second bracket.

Wherein there is a plurality pair of buckles and retaining slots corresponding with each other.

Wherein the first bracket is defined with a positioning slot, and the raised portion of the second bracket is arranged with embossment, interengagement between the positioning slot and the embossment can effectively prevent relative movement between the first bracket and the second bracket.

Wherein the positioning slot and the embossment are interferential fit.

Wherein further comprises a compliant portion in which the positioning slot is located, wherein the embossment push against the compliant portion so as to enter the positioning slot.

Wherein the second bracket is defined with a positioning slot, and the first bracket is arranged with embossment, interengagement between the positioning, slot and the embossment can effectively prevent relative movement between the first bracket and the second bracket.

Wherein the positioning slot and the embossment are interferential fit.

Wherein further comprises a compliant portion in which the positioning slot is located, wherein the embossment push against the compliant portion so as to enter the positioning slot.

Wherein a first bracket includes a first bottom and as first sidewall, and a buckle arranged onto the first bottom, wherein a second bracket includes a second bottom and a second sidewall, a retaining slot being defined in the second bottom, wherein the first and second bottoms are used to support the optical module, and the first and second sidewalls are arranged along peripheral of the optical module.

In order to resolve the technical issues encountered by the prior art, the present invention introduces a solution by providing a backlight module configured with an optical module and a backboard structure disclosed above. Wherein a first bracket includes as first bottom and as first sidewall, and a buckle arranged onto the first bottom, wherein a second bracket includes a second bottom and a second sidewall, a retaining slot being defined in the second bottom, wherein the first and second bottoms are used to support the optical module, and the first and second sidewalls are arranged along peripheral of the optical module.

Wherein the buckle includes a neck stemmed from a bottom of the first bracket, and a presser arranged on a free end of the neck. Wherein the retaining slot includes a first retaining opening and a slit, the first retaining opening being tailored such that the presser can freely pass therethrough, and a thickness of the slit being tailored such that the neck can readily move between the first retaining opening and the slit. And wherein when the presser passes through the first retaining opening and located above the bottom of the second bracket, and the neck being moved to enter the slit so as to have the presser pressing down the bottom of the second bracket, interengagement between the buckle and the retaining slot facilitating interconnection between the first bracket and the second bracket.

Wherein there is a plurality pair of buckles and retaining slots corresponding with each other.

Wherein the first bracket is defined with a positioning slot, and the raised portion of the second bracket is arranged with embossment, or alternatively, the first bracket is arranged with an embossment, and the second bracket is defined with the positioning slot, interengagement between the positioning slot and the embossment can effectively prevent relative, movement between the first bracket and the second bracket.

Wherein further comprise a compliant portion in which the positioning slot is located, wherein the embossment push against the nit portion so as to enter the positioning slot.

The embodiment of the present invention provides a backlight module and a backboard structure incorporated therein. The backboard structure is configured with as first bracket having the buckle, and a second bracket haying defined with the retaining slot. With the interengagement between the buckle and the retaining slot, the embossment and the positioning slot, the backboard structure can be readily constructed by the assembling of the first and second brackets. Since no screws are necessary for the assembling of the backboard structure, no laborious work is required as well. This can effectively reduce the manufacturing cost, and is really beneficial to the automation.

BRIEF DESCRIPTION OF DRAWINGS

In order to give a better and thorough understanding to the whole and other intended purposes, features and advantages of the technical solution of the present invention, detailed description will be given with respect to preferred embodiments provided and illustrated herebelow in accompanied drawings. Apparently, with the spirit of the embodiments disclosed, person in the skilled in the art can readily come out with other modifications as well as improvements without undue experiment. In addition, other drawings can be readily achieved based on the disclosed drawings.

DETAILED DESCRIPTION OF PREFERRED EMBODIMENTS

Figure 2:
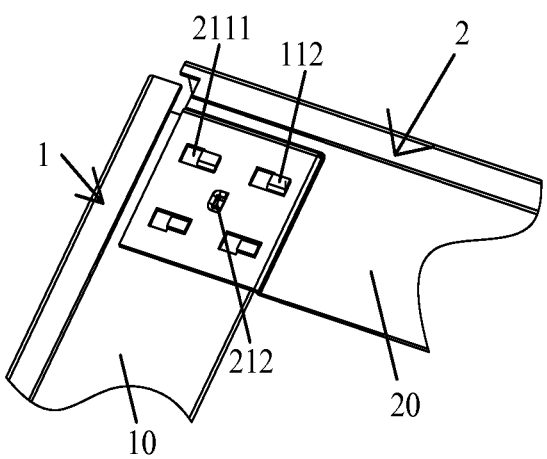
FIG. 2 is a substantial assembled and top view of the first and second brackets of the backboard structure shown in FIG. 1.

Referring to FIG. 2 which is an illustrational and structural view of first and second brackets of a backboard structure made in accordance with the present invention.

In this embodiment, the backboard structure is not limited to a single pair or multiple pair of first and second brackets 1, 2.

Figure 1:
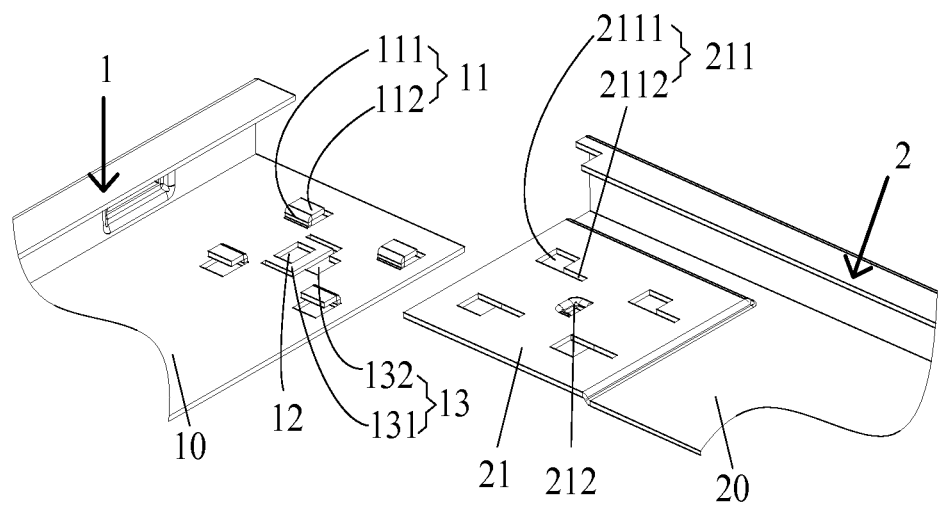
FIG. 1 is an illustrational and structural view of first and second brackets of a backboard structure made in accordance with the present invention.

Substantially, the first bracket 1 is arranged with buckle 11, a positioning slot 12, and a compliant portion 13. The buckle 11 includes a neck 111 stemmed from a bottom 10 of the first bracket 1, and a presser 112 arranged on a free end of the neck 111. Preferably, the neck 111 is vertical to the bottom 10 of the bracket 1, and the presser 112 is in parallel to the bottom 10. It can be readily appreciated that the neck 111 and the presser 112 can be arranged in a way such that a certain angle can be created with respect to the bottom 10. As a result, the arrangement should not be limited. The retaining slot 12 is arranged on the compliant portion 13 which includes a tongue 131 and an opening 132. An end of the tongue 131 is anchored at the bottom 10, and the other end or free end can be moved vertically with respect to the bottom 10. FIG. 1 partially discloses a portion of the first bracket 1. Since a second of the first bracket 1 is identical to what it is disclosed, no further description is given.

Corresponding to the first bracket 1, the second bracket 2 is defined with a raised portion 21 and a bottom 20. The raised portion 21 is defined with retaining slot 211 and an embossment 212. The retaining slot 211 includes a first retaining opening 2111 and a slit 2112 in communication with the retaining opening 2111. As shown in FIG. 1, the dimension of the first retaining opening 2111 is slightly larger than the presser 112. Preferably, the dimension of the first retaining slot 2111 is tailored such that the presser 112 can readily pass through, and the slit 2112 is tailored such that it is slightly larger than the thickness of the neck 111. By this arrangement, once the presser 112 passes through the first retaining opening 2111, the neck 111 can readily move from the first retaining opening 2111 to the slit 2112, and vise versa. That is to say, in assembling, the presser 112 is firstly passing through the first retaining opening 2111, and then projects over the bottom 20 of the second bracket 2. Then the neck 111 slides from the first retaining opening 2111 into the slit 2112 such that the presser 112 presses upon the bottom 20 of the second bracket 2 to securely interlink the first and second brackets 1, 2. In the current embodiment shown in FIG. 1, there are four buckles 11, and four retaining slots 211. However, in the actual application, as long as there is a pair of buckles 11 and retaining slots 211, the interengagement between the first and second brackets 1, 2 is secured. It should be noted that the number of the buckles 11 and the retaining slots 211 can be readily adjusted according to the field requirement. No limitation should be imposed thereupon.

Regarding to the assembling of the first and second brackets 1, 2, the presser 112 is firstly passing through the first retaining opening 2111 from below of the bottom 20 of the second bracket 2 in a way that the neck 111 is aligning with the slit 2112. During this process, the embossment 212 will push against the tongue 131, or pushing a portion of the tongue 131 located between the positioning slot 12 and the opening 132. As a result, the tongue 131 will be pushed to bend toward the bottom 10 adjacent to the opening 132. Afterward, the second bracket 2 is pushed to move toward the first bracket 1 such that the neck 111 enters the slit 2112 until the neck 111 is partially or completely located within the slit 2112. Meanwhile, the presser 112 will securely press down the bottom 20 of the second bracket 2, and the embossment 212 will slide over the tongue 131, and finally enter the positioning slot 12. Of course, the initial contact point of the embossment 212 to the first bracket 1 can be located at the opening 132. In this situation, the embossment 212 is partially in contact with the tongue 131, and the tongue 131 will be bent along the bottom 10 adjacent to the opening 132. Then, the second bracket 2 is pushed such that the embossment 212 will completely enter the positioning slot 12. Preferably, the embossment 212 and the positioning slot 12 are arranged in interferential fit so as to securely retain the embossment 212 within the positioning slot 12. As a result, the first and second brackets 1 and 2 are prevented from relatively sliding movement therebetween. In addition, the first retaining opening 2111 and the slit 2112 can be arranged in different direction such that when the presser 112 passes through the first retaining opening 2111 from below of the bottom 20 of the second bracket 2, the second bracket 2 can be moved toward other direction in a way the neck 111 can readily enter the slit 2112 of the second bracket 2. As it can be readily known to the skilled in the art, no detailed description is given herebelow.

Figure 3:
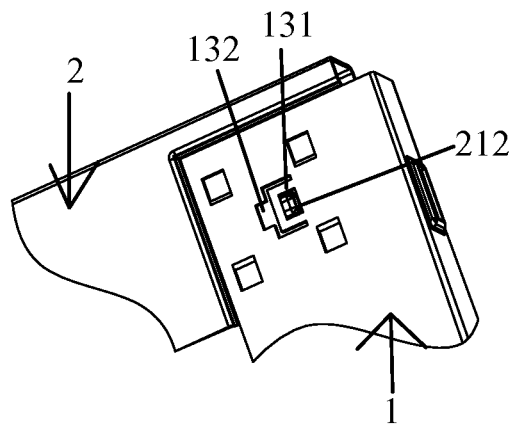
FIG. 3 is a bottom view of the first and second brackets of the backboard structure shown in FIG. 1.

Referring to FIGS. 2 and 3 along with FIG. 1, in which FIG. 2 is a substantial assembled and top view of the first and second brackets of the backboard structure shown in FIG. 1; and FIG. 3 is a bottom view of the first and second brackets of the backboard structure shown in FIG. 1.

If the backboard structure is to be disassembled, then a proper tool can be used to pass through the opening 132, and then pushing the tongue 131 on the surface facing the second bracket 2. Once the tongue 131 is pulled away from the second bracket 2, the embossment 212 can be readily released from the positioning slot 12. In this situation, the second bracket 2 can be readily pulled to move away from the first bracket 1 till the neck 111 enters the first retaining opening 2111. Then, the second bracket 2 can be readily lifted upward to separate the first bracket 1 and the second bracket 2.

In the current embodiment, the backboard structure is configured with a first bracket 1 having the buckle 11, the positioning slot 11 and the compliant portion 13, and a second bracket 2 having defined with the retaining slot 211, and the embossment 212. With the interengagement between the buckle 11 and the retaining slot 211, the embossment 212 and the positioning slot 12, the backboard structure can be readily constructed by the assembling of the first and second brackets 1, 2. Since no screws are necessary for the assembling of the backboard structure, no laborious work is required as well. This can effectively reduce the manufacturing cost, and is really beneficial to the automation.

Figure 4:
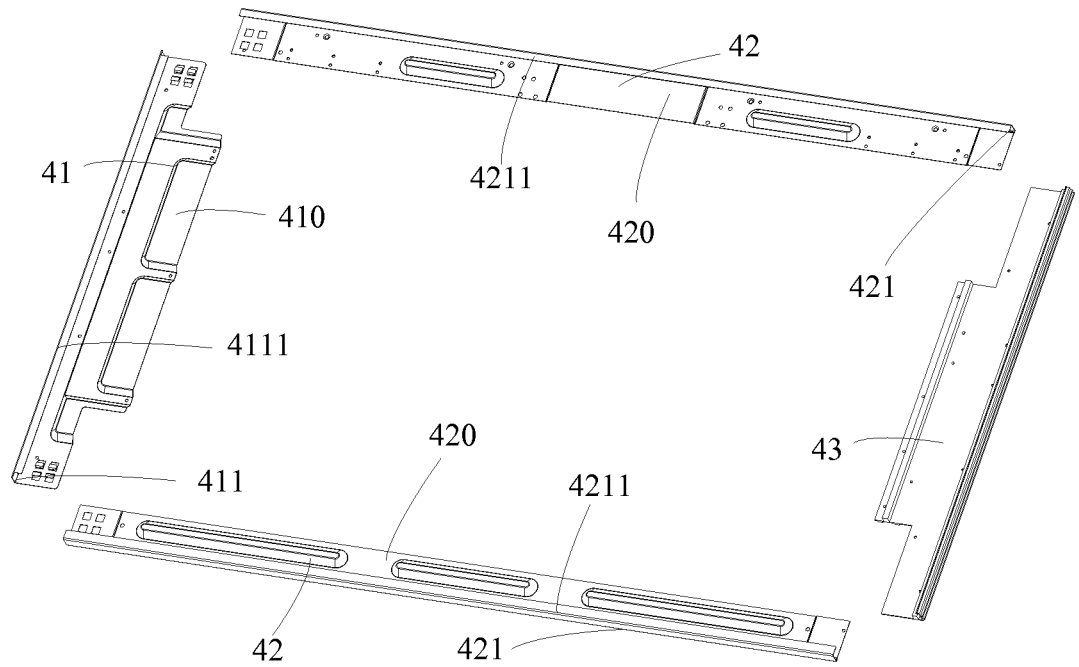
FIG. 4 is an exploded view of a backboard structure used in a backlight module.
Figure 5:
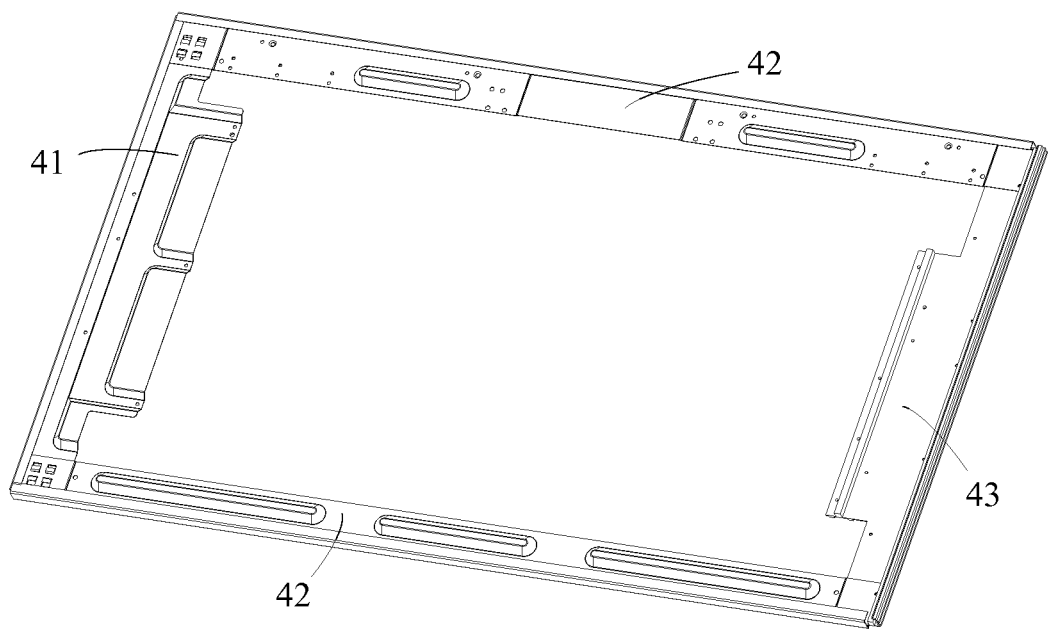
FIG. 5 is an assembled view of the backboard structure of FIG. 4 after assembling.

FIG. 4 is an exploded view of a backboard structure used in a backlight module; and FIG. 5 is an assembled view of the backboard structure of FIG. 4 after assembling.

In the current embodiment, the backlight module includes an optical module and a backboard structure, but will not be limited thereto.

As described above, the backboard is configured with a first bracket 41, a second bracket 42, and a third bracket 43.

The first and second brackets 41, 42 have the identical configuration as the brackets 1, 2 discussed previously. As it can be readily known to the skilled in the art, no detailed description is given.

Further, according to the current embodiment, the first bracket 41 includes a first bottom 410, and a first sidewall 411. A first tab 4111 is arranged on the first sidewall 411 in a position distant to the bottom 410.

There is a pair of second bracket 42, and each includes a second bottom 420, and a second sidewall 421. The second sidewall 421 is arranged with a second tab 4211. The first and second brackets 41, 42 are interconnected with the manner and way discussed above.

The third bracket 43 is provided with a third bottom, a third sidewall, and a third tab, and the third bracket 43 can be readily interconnected to the second bracket 42 by means of fastening. Accordingly, no limitation will be given here.

The backlight module can be configured with the following. The first bottom 410 of the first bracket 41, and the second bottom 420 of the second bracket 42 are used to support the optical module. The first sidewall 411 and second sidewall 421 are arranged on sides of the optical module. By this arrangement, the optical module can be securely and firmly positioned onto the backboard structure. The overall configuration of the backboard structure for the backlight module can be readily seen from FIG. 5.

Referring to FIGS. 4 and 5, the present invention further provides a liquid crystal display device incorporated with the backlight module disclosed above. The first tab 4111, the pair of second tabs 4211, and the third tab of the third bracket 43 jointly support and position the optical module and the liquid crystal display panel. Since this can be readily appreciated by the skilled in the art, no further description is given.

In the current embodiment, the backboard structure is configured with a first bracket 41 having the buckle, the positioning slot, and the compliant portion, and a second bracket 42 having defined with the retaining slot, and the embossment. With the interengagement between the buckle and the retaining slot, the embossment and the positioning slot, the backboard structure can be readily constructed by the assembling of the first and second brackets. Since no screws are necessary for the assembling of the backboard structure, no laborious work is required as well. This can effectively reduce the manufacturing cost, and is really beneficial to the automation.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

The invention claimed is:

1. A liquid crystal display device, wherein the liquid crystal display device is configured with a panel, a backlight module, and a backboard structure incorporated in the backlight module, wherein the backboard structure is configured with a first bracket and a second bracket, the first bracket including a first bottom, a first sidewall, and a buckle disposed on the first bottom, the buckle including a neck stemmed from the bottom of the first bracket, and a presser arranged on a free end of the neck, the second bracket including a raised portion, a second bottom and a second sidewall, a retaining slot being defined in the bottom and configured with a first retaining opening and a slit in communication with the first retaining opening, the first retaining opening being tailored such that the presser can freely pass therethrough, and a thickness of the slit being tailored such that the neck can readily move between the first retaining opening and the slit, wherein when the presser passes through the first retaining opening and located above the bottom of the second bracket, and the neck being moved to enter the slit so as to have the presser pressing down the bottom of the second bracket, interengagement between the buckle and the retaining slot facilitating interconnection between the first bracket and the second bracket;

wherein the backlight module includes an optical module supported by the first bottom and the second bottom, the first sidewall and the second sidewall being arranged along peripheral of the optical module; and wherein the first sidewall is provided with a first tab in a position away from the bottom, and the second sidewall is provided with a second tab in a position away from the second bottom, the first and second tabs are used to position the optical module and support the liquid crystal display panel.

2. The liquid crystal display device as recited in claim 1, wherein the first bracket is defined with a positioning slot, and the raised portion of the second bracket is arranged with embossment, or alternatively, the first bracket is arranged with an embossment, and the second bracket is defined with the positioning slot, interengagement between the positioning slot and the embossment can effectively prevent relative movement between the first bracket and the second bracket.

3. The liquid crystal display device as recited in claim 2, further comprising a compliant portion in which the positioning slot is located, wherein the embossment pushes against the compliant portion so as to enter the positioning slot.

4. A backboard structure for backlight module, comprising:

a first bracket arranged with a buckle; and a second bracket arranged with a raised portion and a retaining slot with respect to the buckle and, interengagement between the buckle and the retaining slot facilitating interconnection between the first and second brackets;

wherein the first bracket is provided with a compliant portion defined with a positioning slot therein, and the raised portion of the second bracket is configured with an embossment, interengagement between the positioning slot and the embossment can effectively prevent relative movement between the first bracket and the second bracket; and wherein the embossment pushes against the compliant portion so as to enter the positioning slot.

5. The backboard structure as recited in claim 4, wherein the buckle includes a neck stemmed from a bottom of the first bracket, and a presser arranged on a free end of the neck;

wherein the retaining slot includes a first retaining opening and a slit, the first retaining opening being tailored such that the presser can freely pass therethrough, and a thickness of the slit being tailored such that the neck can readily move between the first retaining opening and the slit; and wherein when the presser passes through the first retaining opening and located above the bottom of the second bracket, and the neck being moved to enter the slit so as to have the presser pressing down the bottom of the second bracket, interengagement between the buckle and the retaining slot facilitating interconnection between the first bracket and the second bracket.

6. The backboard structure as recited in claim 5, wherein there is a plurality pair of buckles and retaining slots corresponding with each other.

7. The backboard structure as recited in claim 4, wherein the positioning slot and the embossment are interferential fit.

8. A backlight module configured with an optical module and a backboard structure as recited in claim 1, wherein a first bracket includes a first bottom and a first sidewall, and a buckle arranged onto the first bottom, wherein a second bracket includes a second bottom and a second sidewall, a retaining slot being defined in the second bottom, wherein the first and second bottoms are used to support the optical module, and the first and second sidewalls are arranged along peripheral of the optical module.

9. The backlight module as recited in claim 8, wherein the buckle includes a neck stemmed from a bottom of the first bracket, and a presser arranged on a free end of the neck;

wherein the retaining slot includes a first retaining opening and a slit, the first retaining opening being tailored such that the presser can freely pass therethrough, and a thickness of the slit being tailored such that the neck can readily move between the first retaining opening and the slit; and wherein when the presser passes through the first retaining opening and located above the bottom of the second bracket, and the neck being moved to enter the slit so as to have the presser pressing down the bottom of the second bracket, interengagement between the buckle and the retaining slot facilitating interconnection between the first bracket and the second bracket.

10. The backlight module as recited in claim 9, wherein there is a plurality pair of buckles and retaining slots corresponding with each other.

11. The backlight module as recited in claim 8, wherein the first bracket is defined with a positioning slot, and the raised portion of the second bracket is arranged with an embossment, or alternatively, the first bracket is arranged with an embossment, and the second bracket is defined with the positioning slot, interengagement between the positioning slot and the embossment can effectively prevent relative movement between the first bracket and the second bracket.

12. The backlight module as recited in claim 11, further comprising a compliant portion in which the positioning slot is located, wherein the embossment pushes against the compliant portion so as to enter the positioning slot.

13. A backboard structure for backlight module, comprising:

a first bracket arranged with a buckle; and a second bracket arranged with a retaining slot with respect to the buckle, interengagement between the buckle and the retaining slot facilitating interconnection between the first and second brackets;

wherein the second bracket is defined with a compliant portion defined with a positioning slot therein, and the first bracket is arranged with an embossment, interengagement between the positioning slot and the embossment can effectively prevent relative movement between the first bracket and the second bracket; and wherein the embossment pushes against the compliant portion so as to enter the positioning slot.

14. The backboard structure as recited in claim 13, wherein the positioning slot and the embossment are interferential fit.

* * * * *